(12) United States Patent
Chang et al.

(10) Patent No.: US 9,105,318 B2
(45) Date of Patent: Aug. 11, 2015

(54) MEMORY DEVICE AND METHOD OPERABLE TO PROVIDE MULTI-PORT FUNCTIONALITY THEREOF

(71) Applicant: INDUSTRIAL TECHNOLOGY RESEARCH INSTITUTE, Hsin-Chu (TW)

(72) Inventors: Chih-Yu Chang, Hsinchu (TW); Wei-Zheng Lu, Chiayi (TW); Fu-Chiang Jan, Miaoli County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 13 days.

(21) Appl. No.: 14/062,560

(22) Filed: Oct. 24, 2013

(65) Prior Publication Data

US 2014/0362651 A1 Dec. 11, 2014

Related U.S. Application Data

(60) Provisional application No. 61/832,294, filed on Jun. 7, 2013.

(51) Int. Cl.
*G11C 7/00* (2006.01)
*G11C 7/10* (2006.01)
*G11C 7/22* (2006.01)

(52) U.S. Cl.
CPC ............ *G11C 7/1066* (2013.01); *G11C 7/1075* (2013.01); *G11C 7/1093* (2013.01); *G11C 7/22* (2013.01)

(58) Field of Classification Search
CPC ....... G11C 7/22; G11C 7/1072; G11C 7/1006
USPC .............. 365/189.14, 230.05, 189.01, 233, 365/189.04
See application file for complete search history.

(56) References Cited

U.S. PATENT DOCUMENTS

| 5,761,147 A | 6/1998 | Lindner et al. |
| 5,933,855 A | 8/1999 | Rubinstein |

(Continued)

FOREIGN PATENT DOCUMENTS

| CN | 100388252 C | 5/2008 |
| CN | 101236774 A | 8/2008 |

OTHER PUBLICATIONS

Synthesis of Memories From Behavioral HDLs, Nels Vander Zanden, ASIC Conference and Exhibit,1994. Proceedings., Seventh Annual IEEE International, Sep. 1994, p. 71-p. 74.

(Continued)

*Primary Examiner* — Connie Yoha
(74) *Attorney, Agent, or Firm* — Rabin & Berdo, P.C.

(57) ABSTRACT

A memory device operable to provide multi-port functionality, which may comprise a single-port memory having a first operating frequency that is at least twice of a second operation frequency of a multi-port memory, a read synchronization module that synchronizes a set of read signals from the second operation frequency to the first operating frequency, a write synchronization module that synchronizes a set of write signals from the second operation frequency to the first operating frequency, a read/write signal selector that integrates a set of synchronized read signals and a set of synchronized write signals into a set of input control signals of the single-port memory, and a read out data synchronization module configured to synchronize a set of read out data from the single-port memory with the second operation frequency of the multi-port memory.

19 Claims, 15 Drawing Sheets

(56) References Cited

U.S. PATENT DOCUMENTS

| | | | |
|---|---|---|---|
| 5,982,699 A | 11/1999 | Dilbeck | |
| 6,314,047 B1* | 11/2001 | Keay et al. | 365/230.05 |
| 7,251,186 B1* | 7/2007 | Kengeri et al. | 365/230.05 |
| 7,349,285 B2 | 3/2008 | Balasubramanian et al. | |
| 7,533,222 B2 | 5/2009 | Leung | |
| 7,738,496 B1* | 6/2010 | Raza | 370/503 |
| 7,934,057 B1 | 4/2011 | Raza | |
| 8,102,721 B2 | 1/2012 | Guo et al. | |
| 8,374,050 B2 | 2/2013 | Zhou et al. | |
| 2003/0081449 A1 | 5/2003 | Beucler | |
| 2007/0183241 A1 | 8/2007 | Batra | |
| 2008/0181040 A1* | 7/2008 | Huang et al. | 365/219 |
| 2012/0224435 A1 | 9/2012 | Nukaraju et al. | |
| 2013/0290646 A1* | 10/2013 | Greenwood et al. | 711/149 |

OTHER PUBLICATIONS

An on-chip 72 K pseudo two-port cache memory subsystem, Chuang, S.C.-M. Mukherjee, T. ; Braceras, G. ; Litten, S. ; Peters, M. ; LeBlanc, J. ; Taroni, G. ; Akrout, C., VLSI Circuits, 1990. Digest of Technical Papers., 1990 Symposium on, Jun. 1990, p. 113-p. 114.

Pipelined Parallel AC-Based Approach for Multi-String Matching, Wei Lin, Parallel and Distributed Systems, 2008. ICPADS '08. 14th IEEE International Conference on, Dec. 2008, p. 665-p. 672.

Design of Dual-Processor Sharing DRAM Controller, Zhang Bo, Computer Science and Engineering, 2009. WCSE '09. Second International Workshop on, Oct. 2009, p. 298-p. 302.

Pipelined, Time-sharing Access Technique for an Integrated Multiport Memory, Ken-ichi Endo, Tsuneo Matsumura, and Junzo Yamada, IEEE Journal of Solid-State Circuits, vol. 26, Apr. 1991, 4.

* cited by examiner

MEMORY DEVICE AND METHOD OPERABLE TO PROVIDE MULTI-PORT FUNCTIONALITY THEREOF

CROSS-REFERENCE TO RELATED APPLICATION

The present application is based on, and claims priority from, U.S. Provisional Application No. 61/832,294 filed Jun. 7, 2013, the disclosure of which is hereby incorporated by reference herein in its entirety.

TECHNICAL FIELD

The disclosure generally relates to a memory device and a method operable to provide multi-port functionality thereof.

BACKGROUND

In the digital circuit design, memories are often used in, but not limited to, data buffering, being a temporary media for data transferring among different computing modules, etc. During a same memory cycle in a real time operation system, a module may write data to a memory in one address and another module may read data from the memory in another address for operations. In this situation, the functionality able to read data from and write data to the memory at the same time be provided. In general, a multi-port memory, such as a two-port memory may be employed to perform the functionality. The structure of a two-port memory has two input ports, which may simultaneously input related signals needed for the read and write operations. Designers may control the read and write control signals properly, and apply these control signals to the two-port memory. Simultaneously storing data to and reading data from the memory may be easily achieved. For example, on the write port, a write enable signal may accompany with a write address signal and a write data signal. When the write enable signal is at logic high, this two port memory may write the write data to a relative position. On the read port, a read enable signal may accompany with a read address signal. When the read enable signal is at logic high, this two-port memory may reads out the data in an address during the next clock cycle.

The two-port memory may simultaneously perform a memory write operation and a memory read operation within a clock cycle. The single-port memory may only perform a memory read or write operation within a clock cycle. When an Application-Specific Integrated Circuit (ASIC) tapes out and the memory capacity is too large, a single-port memory device operable to provide multi-port functionality may be one of solutions to the issue.

SUMMARY

The exemplary embodiments of the present disclosure may provide a memory device and a method operable to provide multi-port functionality.

One exemplary embodiment relates to a memory device operable to provide multi-port functionality. The memory device may comprise a single-port memory, at least one read synchronization module, at least one write synchronization module, a read/write signal selector, and a read out data synchronization module. The single-port memory has a first operating frequency that is at least twice of a second operation frequency of a multi-port memory. The read synchronization module synchronizes a set of read signals from the second operation frequency to the first operating frequency. The write synchronization module synchronizes a set of write signals from the second operation frequency to the first operating frequency. The read/write signal selector integrates a set of synchronized read signals and a set of synchronized write signals into a set of input control signals of the single-port memory. The read out data synchronization module is configured to synchronize a set of read out data of the single-port memory from the first operating frequency to the second operation frequency of the multi-port memory.

Another exemplary embodiment relates to a method operable to provide multi-port functionality. The method may comprise: preparing a single-port memory having a first operating frequency that is at least twice of a second operation frequency of a multi-port memory; synchronizing a set of read signals from the second operation frequency to the first operating frequency, and synchronizing a set of write signals from the second operation frequency to the first operating frequency; integrating a set of synchronized read signals and a set of synchronized write signals into a set of input control signals of the single-port memory; and synchronizing a set of read out data of the single-port memory from the first operating frequency to the second operation frequency of the multi-port memory.

The foregoing and other features and aspects of the disclosure will become better understood from a careful reading of a detailed description provided herein below with appropriate reference to the accompanying drawings.

DETAILED DESCRIPTION OF THE EXEMPLARY EMBODIMENTS

Figure 1:
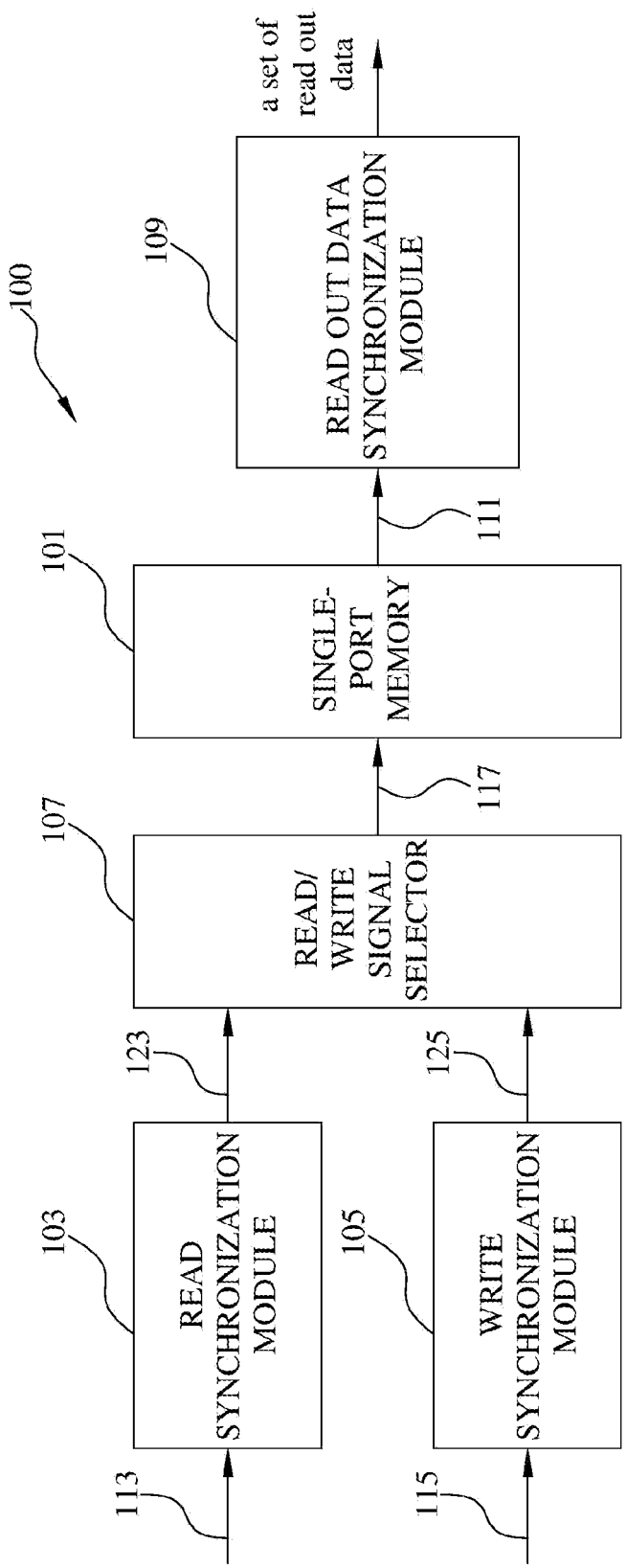
FIG. 1 shows a memory device operable to provide multi-port functionality, according to an exemplary embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

According to the exemplary embodiments in the disclosure, a technology is provided by using the architecture of a single-port memory to construct the structure operable to provide the functionality of a multi-port memory. The multi-port memory may simultaneously write data to and read data from the memory within a clock cycle, while a single-port memory may either write data to or read data from the memory within a clock cycle. In order to use a single-port memory to construct the structure operable to provide the functionality of the multi-port memory, the exemplary embodiments may do some conversions on the input and output signals to fit the multi-port memory and the single-port memory. Therefore, the exemplary embodiments disclose the architecture which may convert the multi-port memory's input signals into the single-port memory's input signals, and also convert the single-port memory's read out signals into the multi-port memory output signals.

FIG. 1 shows a memory device operable to provide multi-port functionality, according to an exemplary embodiment. Referring to FIG. 1, the memory device 100 may comprise a single-port memory 101, at least one read synchronization module 103, at least one write synchronization module 105, a read/write signal selector 107, and a read out data synchronization module 109. The single-port memory 101 has a first operating frequency that is at least twice of a second operation frequency of a multi-port memory. The at least one read synchronization module 103 synchronizes a set of read signals 113 from the second operation frequency to the first operating frequency. The at least one write synchronization module 105 synchronizes a set of write signals 115 from the second operation frequency to the first operating frequency. The read/write signal selector 107 integrates a set of synchronized read signals 123 and a set of synchronized write signals 125 into a set of input control signals 117 of the single-port memory 101. The read out data synchronization module 109 is configured to synchronize a set of read out data 111 of the single-port memory 101 from the first operating frequency to the second operation frequency of the multi-port memory, thereby, generating a set of read out data of the multi-port memory.

The input control signals of a single port memory may include a read/write enable signal, a read/write address signal, and a write data signal. The outputted signal of the single port memory may include a read out data. When the read/write enable signal Wr_en is at logic high, it may indicate that a memory write operation is performed and the write data is written to the memory address. When the read/write enable signal is at logic low, it may indicate a memory read operation is performed and the memory reads out the data from a memory address during the next clock cycle.

According to the exemplary embodiments in the disclosure, the set of synchronized read signals 123 and the set of synchronized write signals 125 are distributed over different clocks in the clock domain of the single-port memory 101. The distributed order in the clock domain for the set of synchronized read signals 123 and the set of synchronized write signals 125 may be decided by a system that employs the memory device 100. The first operating frequency of the single-port memory 101 may be at least k times of the second operation frequency of a multi-port memory, wherein k is a positive real number, and k≥2.

Figure 2:
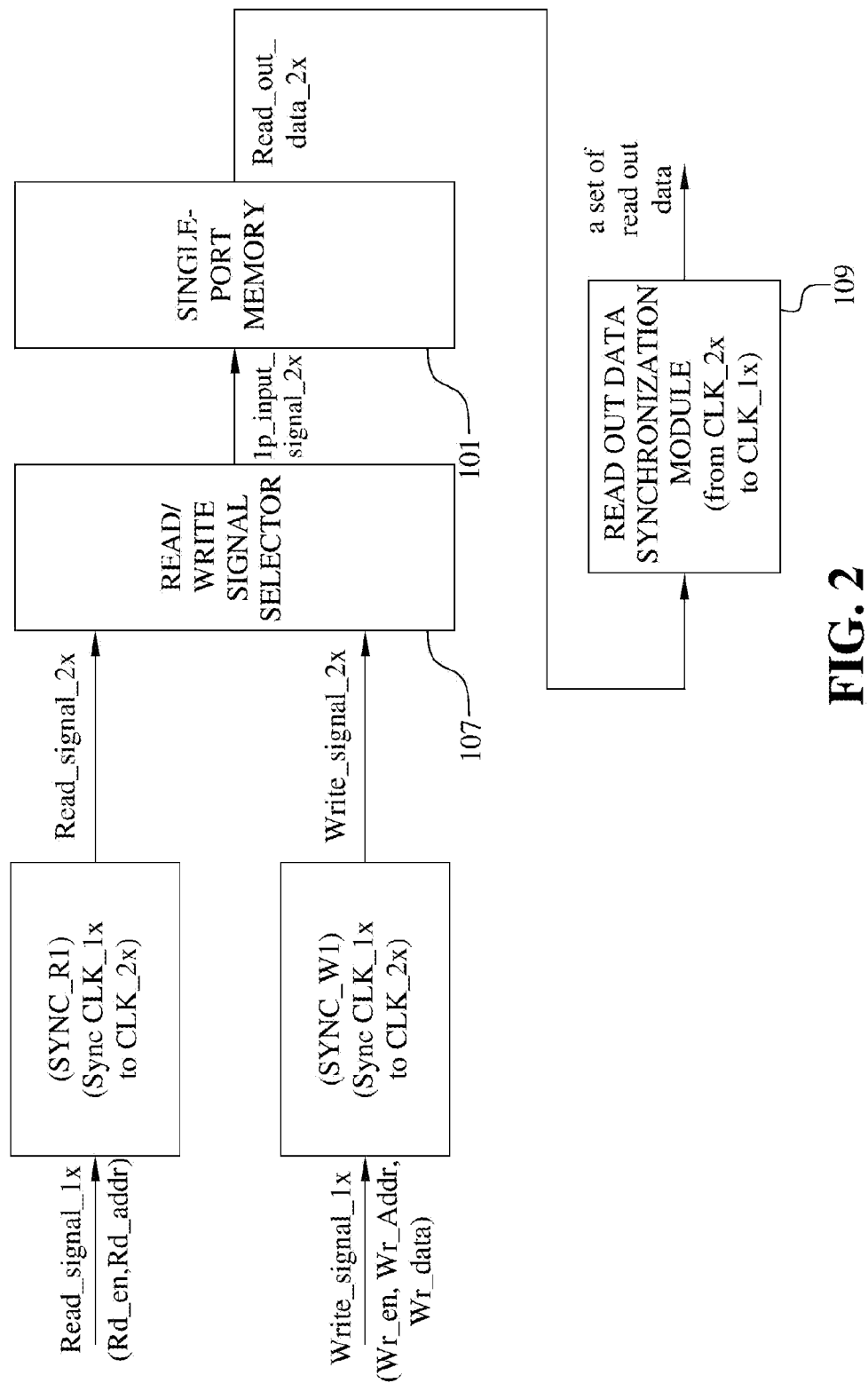
FIG. 2 shows an example of the memory device, wherein the operating frequency of the single-port memory is twice as the operating frequency of a two-port memory, according to an exemplary embodiment.
Figure 3:
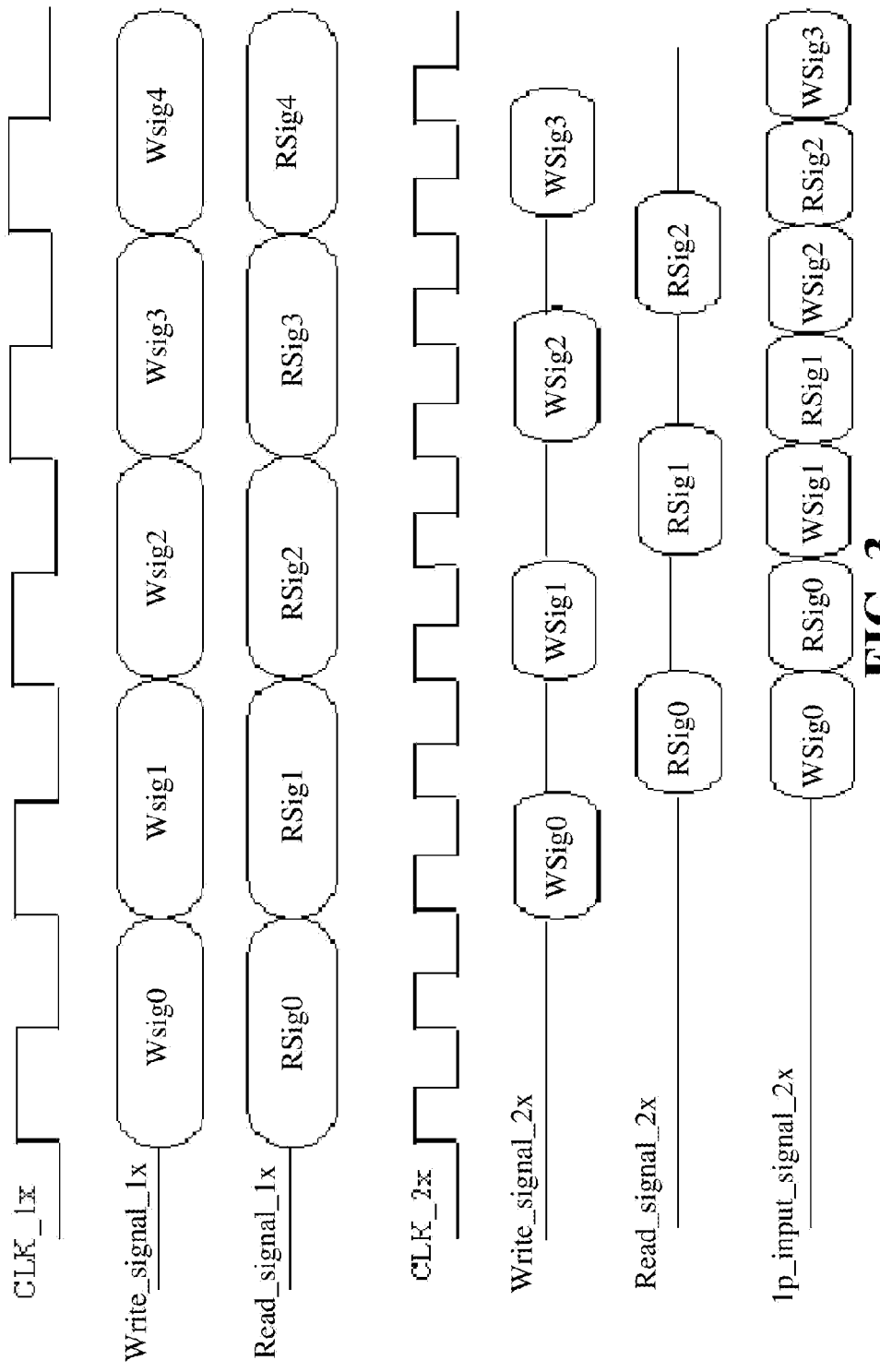
FIG. 3 shows a timing diagram illustrating the timing relationship of various signals for providing the memory device shown in FIG. 2, according to an exemplary embodiment.

FIG. 2 shows an example of a memory device, wherein the operating frequency CLK__2x of a single-port memory is two times of the operating frequency CLK__1x of a two-port memory, according to an exemplary embodiment. In other words, the operating frequency CLK__1x is used in a system that employs the memory device of FIG. 1. FIG. 3 shows a timing diagram illustrating the timing relationship of various signals for providing the memory device shown in FIG. 2, according to an exemplary embodiment.

A two-port memory in the digital circuit design may have a dedicated read port for inputting a group of read control signals and outputting a data signal, and a dedicated write port for inputting a group of write control signals. Each control signal on the write port, denoted by Write_signal__1x, may include a write enable signal Wr_en, a write address signal Wr_addr, and a write data signal Wr_data. Each control signal on the read port, denoted by Read_signal__1x, may include a read enable signal Rd_en and a read address signal Rd_addr, and there is an outputted signal Rd_data for reading data from the memory.

Referring to FIG. 2 and FIG. 3, both of the read input control signals such as RSig0~RSig4 and write input control signals such as WSig0~WSig4 at operation frequency CLK__1x of the two-port memory are synchronized via two synchronization modules (read synchronization module SYNC_R1 and write synchronization module SYNC_W1), respectively, to the operating frequency CLK__2x of the single-port memory. Through these two synchronization modules, read and write input control signals are distributed over different clock cycles in the clock domain of the single-port memory, shown as Write_signal__2x and Read_signal__2x in FIG. 3. These two sets of synchronized input control signals Write_signal__2x and Read_signal__2x are further integrated by the Read/Write signal selector 107, thereby generating a set of input control signals 1p_input_signal__2x distributed over different clock cycles in the clock domain of the single-port memory 101, as shown in FIG. 3. The input control signals 1p_input_signal__2x may control the access to the single-port memory 101, thereby outputting the read out data labeled as Read_out_data__2x. The read out data Read_out_data__2x are further converted into the operation frequency CLK__1x of the two-port memory for further operations in the system. In other words, the read out data Read_out_data__2x from the single-port memory are transferred back to the original system's operating frequency CLK__1x for further operations in the original system.

Figure 4:
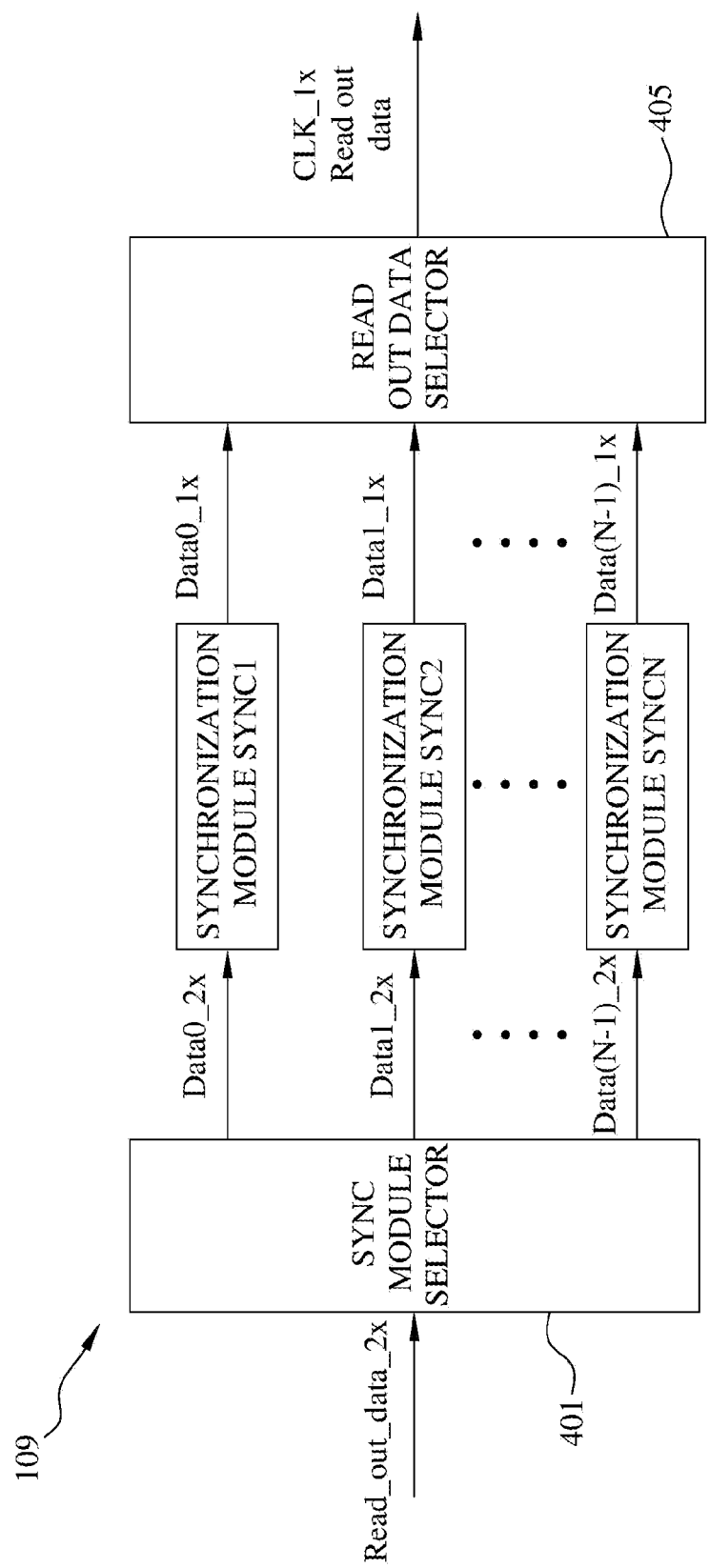
FIG. 4 shows a schematic view illustrating an exemplary detailed structure for the read out data synchronization module, according to an exemplary embodiment.

FIG. 4 shows a schematic view illustrating an exemplary detailed structure for the read out data synchronization module, according to an exemplary embodiment. Referring to FIG. 4, the read out data synchronization module 109 may further include a Sync module selector 401, a group of synchronization modules, say synchronization module SYNC1, . . . , synchronization module SYNCN, N≥2, and a read out data selector 405. The Sync module selector 401 controls each of the set of read out data such as Data0__2x~Data(N−1)__2x from the single-port memory 101 may use which one of the group of synchronization modules. The group of synchronization modules may synchronize the set of read out data such as Data0__2x~Data(N−1)__2x of the single-port memory 101 from the first operating frequency to an original system's operating frequency for further operations in the original system. The read out data selector 405 may integrate the synchronized read out data such as Data0__1x~Data(N−1)__1x from the group of synchronization modules into a set of output data such as CLK__1x Read out data with a data format consistent with that of the multi-port memory.

Since the faster frequency signals are synchronized to a slower frequency, it may go through several CLK__1x clock timings before the set of read out data 111 are synchronized to a stable state. When the read control signals of the multi-port memory are enabled for a long time, only one single synchronization module is used will result in missing some data. Therefore, for the read out data from single-port memory, a max timing latency caused by the synchronization from an original single-port memory's operating frequency CLK_SP to a system's operating frequency CLK__1x is first calculated in one exemplary embodiment of the disclosure. Since each read out signal with the single-port memory's operating frequency CLK_SP may have a different phase against with the system's operating frequency CLK__1x, therefore, a max synchronize clock latency, i.e. M×CLK__1x, is calculated in one exemplary embodiment of the disclosure as the max timing latency, according to the single-port memory's CLK_SP and each read out data, wherein the number of the synchronization modules N is greater than or equal to M, and M is the number of clocks of a maximum timing latency caused by the synchronization from the first operating frequency of the single-port memory to the system's operating frequency.

With the N synchronization modules, N≥M, the output data from the single-port memory may choose different synchronization modules for performing synchronization. This may avoid the data missing problem. A counter may be used as a control indicator to indicate a corresponding synchronization module of the N synchronization modules for each read out data in the synchronization process. According to the control indicator, the output data from the single-port memory may choose a corresponding synchronization module via the Sync module selector 401 to synchronize the data. In the exemplary embodiments, there are N synchronization modules, and each synchronization module may start up at a different time. In one exemplary embodiment, the Sync module selector 401 may determine which Sync module is selected and when the selected Sync module starts up.

For example, first Sync module such as synchronization module SYNC1 is enabled upon the first read out data is outputted from the single-port memory, $2^{nd}$ Sync module such as synchronization module SYNC2 is enabled upon the second read out data is outputted from the single-port memory, . . . , $N^{th}$ Sync module such as synchronization module SYNCN is enabled upon the $N^{th}$ read out data is outputted from the single-port memory, first Sync module such as synchronization module SYNC1 is enabled upon the $(N+1)^{th}$ read out data is outputted from the single-port memory, $2^{nd}$ Sync module such as synchronization module SYNC2 is enabled upon the $(N+2)^{th}$ read out data is outputted from the single-port memory, . . . , and so on. In other words, the Sync module selector 401 takes turn to enable a different Sync module of the N Sync modules for each read out data from the single-port memory.

Figure 5:
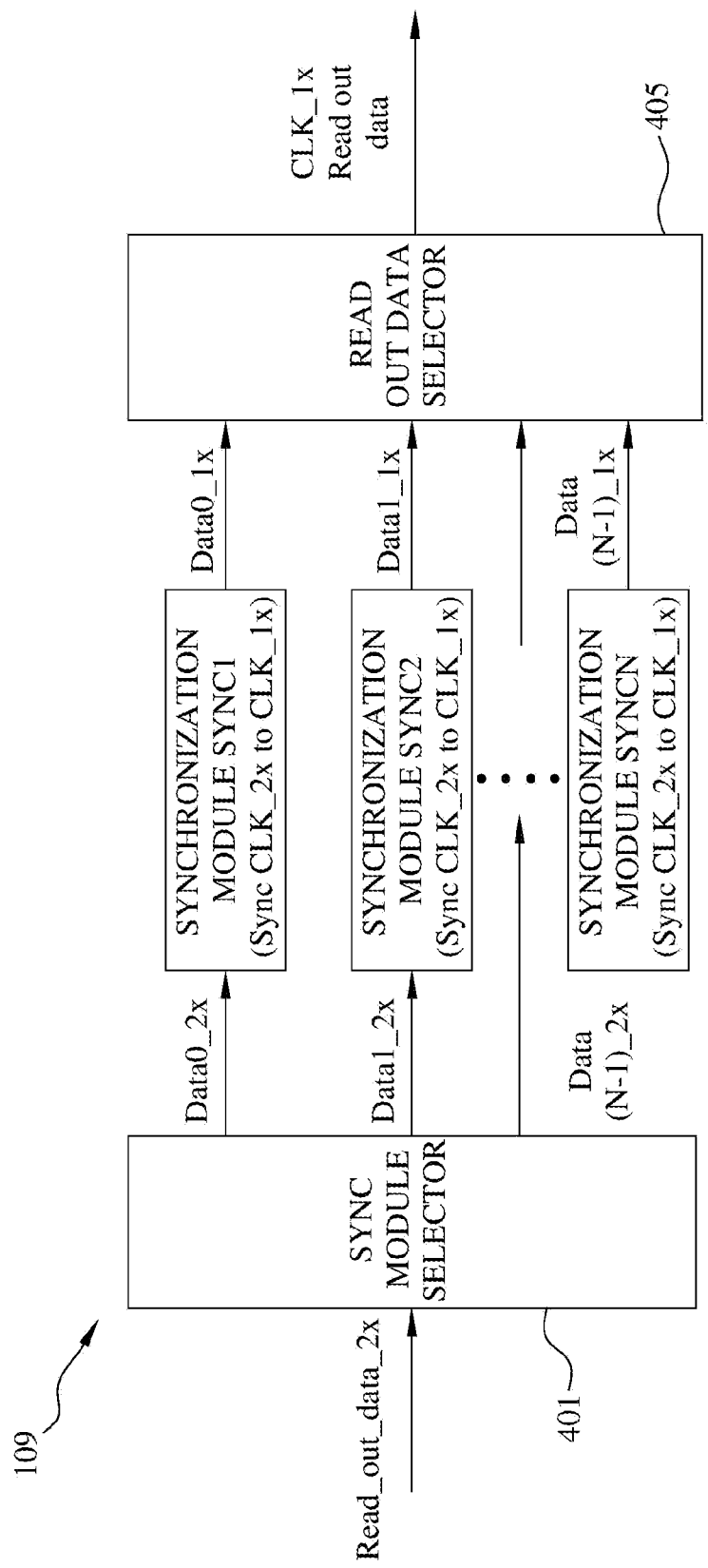
FIG. 5 shows an example of the read out data synchronization module, wherein the operating frequency of the single-port memory is twice as the operating frequency of a two-port memory, according to an exemplary embodiment.

FIG. 5 shows an example of the read out data synchronization module, wherein the operating frequency of the single-port memory is twice as the operating frequency of a two-port memory, according to an exemplary embodiment. As shown in FIG. 5, the Sync module selector 401 controls each of the read out data Read_out_data__2x from the single-port memory 101 may use which synchronization module. In the example, Data0__2x uses synchronization module SYNC1, Data1__2x uses synchronization module SYNC2, Data2__2x uses synchronization module SYNC3, . . . , DataN−1__2x uses synchronization module SYNCN. Each Datak__2x is converted to Datak__1x, 0≤k≤N−1, after the synchronization from the operating frequency CLK__2x to the operating frequency CLK__1x. The read out data selector 405 then integrates these synchronized read out data, i.e. Data0__1x~DataN−1__1x, from the N synchronization modules, i.e. synchronization module SYNC1~synchronization module SYNCN, into a set of output data (i.e. CLK__1x Read out data) with a data format consistent with that of the two-port memory.

Figure 6:
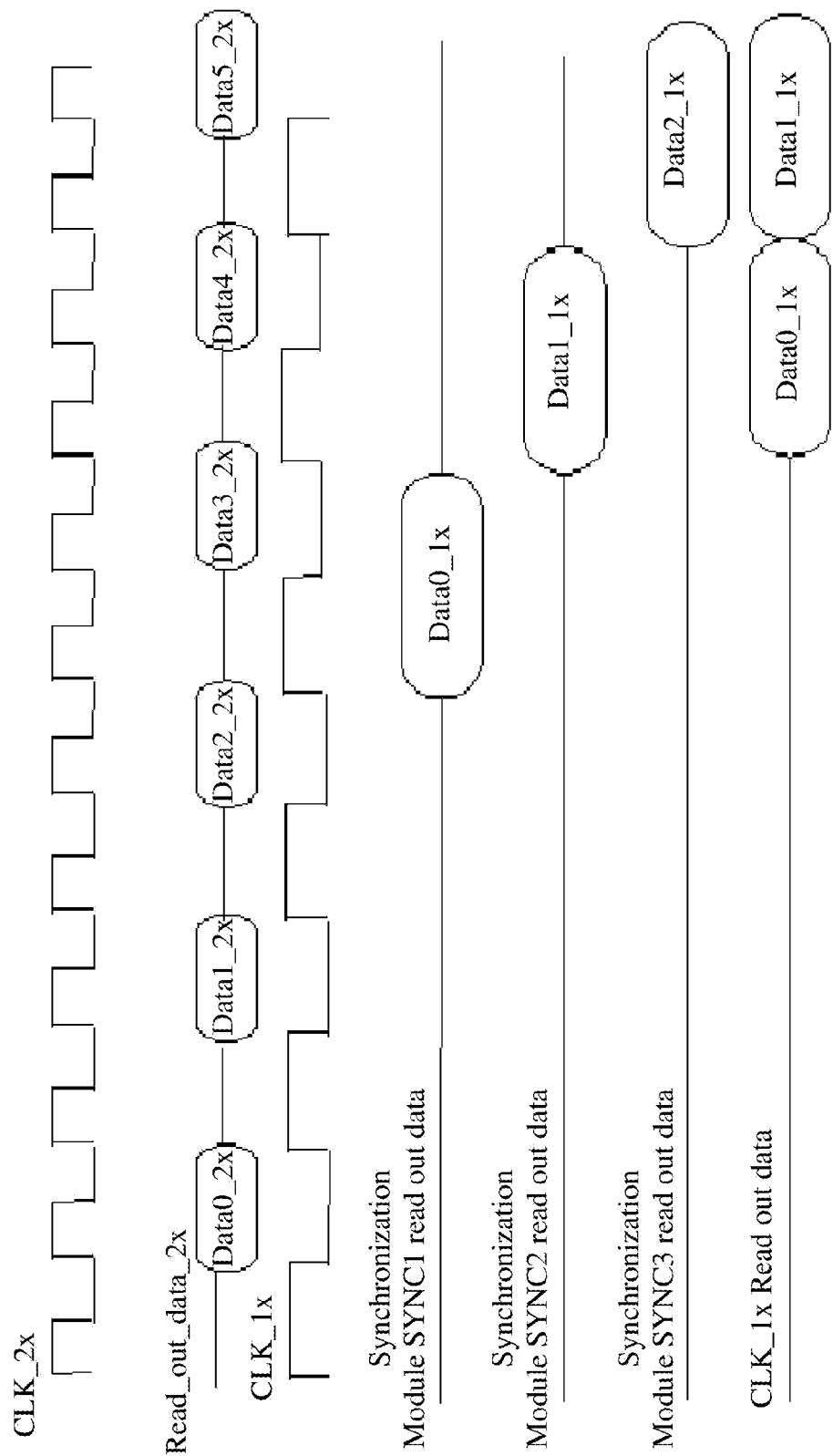
FIG. 6 shows a timing diagram illustrating the timing relationship of various signals for providing the read out data synchronization module shown in FIG. 5, according to an exemplary embodiment.

FIG. 6 shows a timing diagram illustrating the timing relationship of various signals for providing the read out data synchronization module in FIG. 5, according to an exemplary embodiment. In FIG. 6, assume that the number of the synchronization modules N is 3, this means that three synchronization modules, i.e. synchronization module SYNC1~synchronization module SYNC3, are used for synchronizing the output data from the single-port memory. The Sync module selector 401 controls each of the read out data Read_out_data__2x, such as Data0__2x~Data5__2x, from the single-port memory may use which synchronization module. In this example, Data0__2x uses synchronization module SYNC1, Data1__2x uses synchronization module SYNC2, Data2__2x uses synchronization module SYNC3, Data3__2x uses synchronization module SYNC1, Data4__2x uses synchronization module SYNC2, and Data5__2x uses synchronization module SYNC3. With the synchronization module SYNC1~synchronization module SYNC3, each Datak__2x is converted to Datak__1x, 0≤k≤5, after the synchronization from the operating frequency CLK__2x to the operating frequency CLK__1x. These synchronized read out data, i.e. Data0__1x~Data5__1x, from synchronization module SYNC1~synchronization module SYNC3, are integrated into a set of output data (i.e. CLK__1x Read out data).

Figure 7:
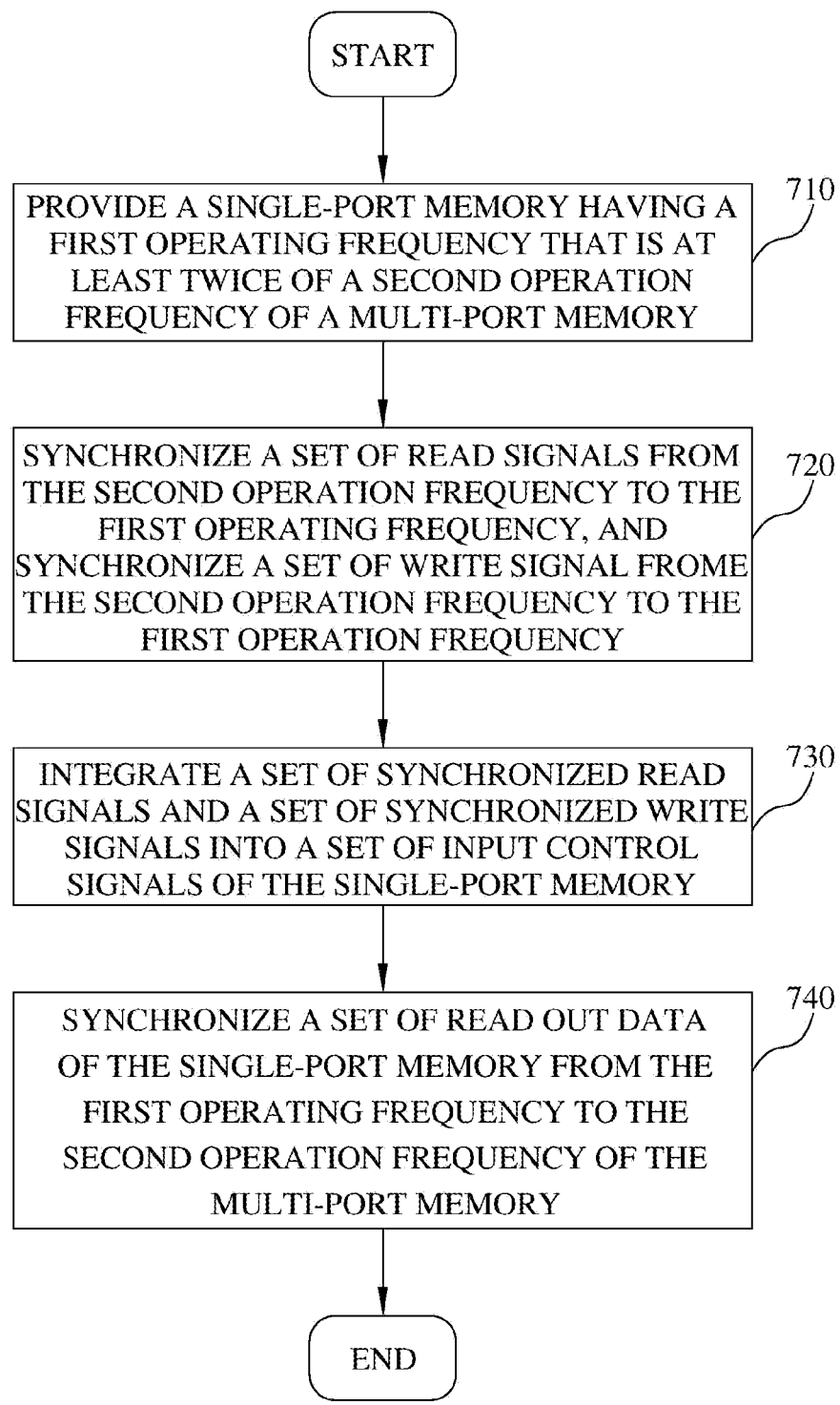
FIG. 7 shows a method operable to provide multi-port functionality, according to an exemplary embodiment.

According to an exemplary embodiment of the disclosure, a method operable to provide multi-port functionality may be shown in FIG. 7. In step 710, a single-port memory having a first operating frequency is provided, wherein the first operating frequency is at least twice of a second operation frequency of a multi-port memory. In step 720, a set of read signals are synchronized from the second operation frequency to the first operating frequency, and a set of write signals are synchronized from the second operation frequency to the first operating frequency. In step 730, a set of synchronized read signals and a set of synchronized write signals are integrated into a set of input control signals of the single-port memory. In step 740, a set of read out data of the single-port memory are synchronized from the first operating frequency to the second operation frequency of the multi-port memory.

As mentioned earlier, the first operating frequency of the single-port memory may be at least k times of the second operation frequency of a multi-port memory, wherein k is a positive real number, and k≥2. Also, the set of synchronized read signals and the set of synchronized write signals are distributed over different clocks in the clock domain of the single-port memory. The distributed order in the clock domain for the set of synchronized read signals and the set of synchronized write signals may be decided by a system that employs the memory device.

The followings give more examples for illustrating various architectures from multi-port to single port, and their corresponding timing diagrams to describe the timing relationship of various signals for providing the architectures from multi-port to single port. Also, more examples are given for illustrating various substitutions and modifications of the read out data synchronization module from single port to multi-port, and their corresponding timing diagrams to describe the timing relationship of various signals for providing the various substitutions and modifications of the read out data synchronization module.

Figure 8:
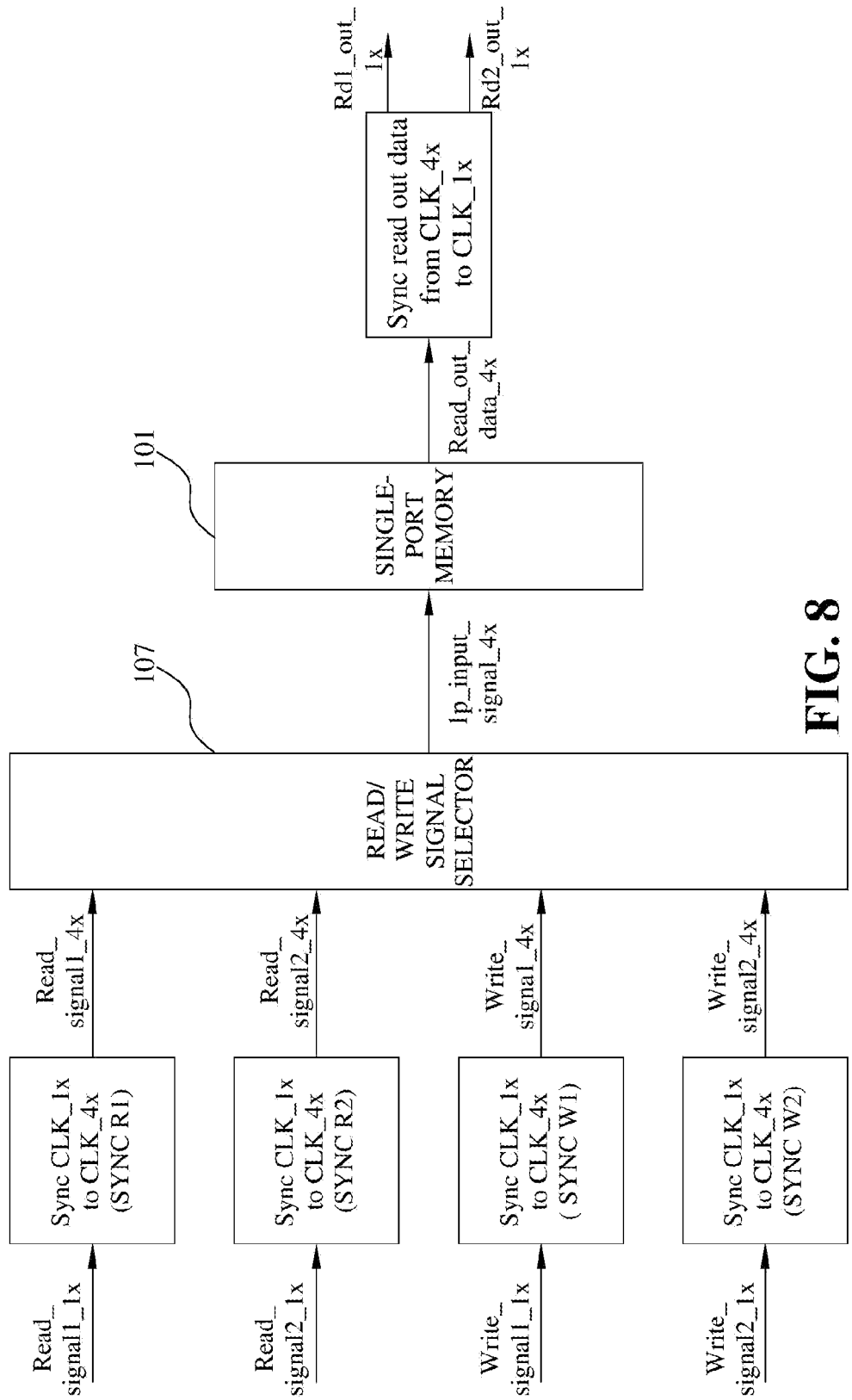
FIG. 8 shows an exemplary architecture from 4-port to single port, according to an exemplary embodiment.

FIG. 8 shows an exemplary architecture from 4-port to single port, according to an exemplary embodiment. The differences of the embodiment of FIG. 8 compared to the details of FIG. 2 are described for conciseness. Similar components (even if operated differently) are shown with similar reference numbers, again for conciseness. In FIG. 8, it is assumed that two ports are for reading signals and the other two ports are for writing signals. The operating frequency CLK__4x of the single-port memory is four times of a system operating frequency CLK__1x. The Read_signal1__1x and Read_signal2__1x are two input control signals for the two read ports, and the Write_signal1__1x and Write_signal2__1x are two input control signals for the two write ports. Four different synchronization modules synchronously control the four input control signals to the memory's operating frequency. The first read signal is Read_signal1__4x after synchronization, and the second read signal is Read_signal2__4x after synchronization. Similarly, the first write signal is Write_signal1__4x after synchronization, and the second write signal is Write_signal2__4x after synchronization. The four synchronized control signals are further processed by the read/write signal selector 107 to obtain an input control signal 1p_input_signal__4x for the single-port memory 101. The read out data from the single-port memory 101 is read_out_data__4x. Because the original input uses two read ports, two read data are generated after the synchronization by the read out data synchronization module from the operating frequency CLK__4x to the operating frequency CLK 1x. The read out data corresponding to the original Read_signal1__1x is Rd1_out__1x, and the read out data corresponding to the original Read_signal2__1x is Rd2_out__1x.

Figure 9:
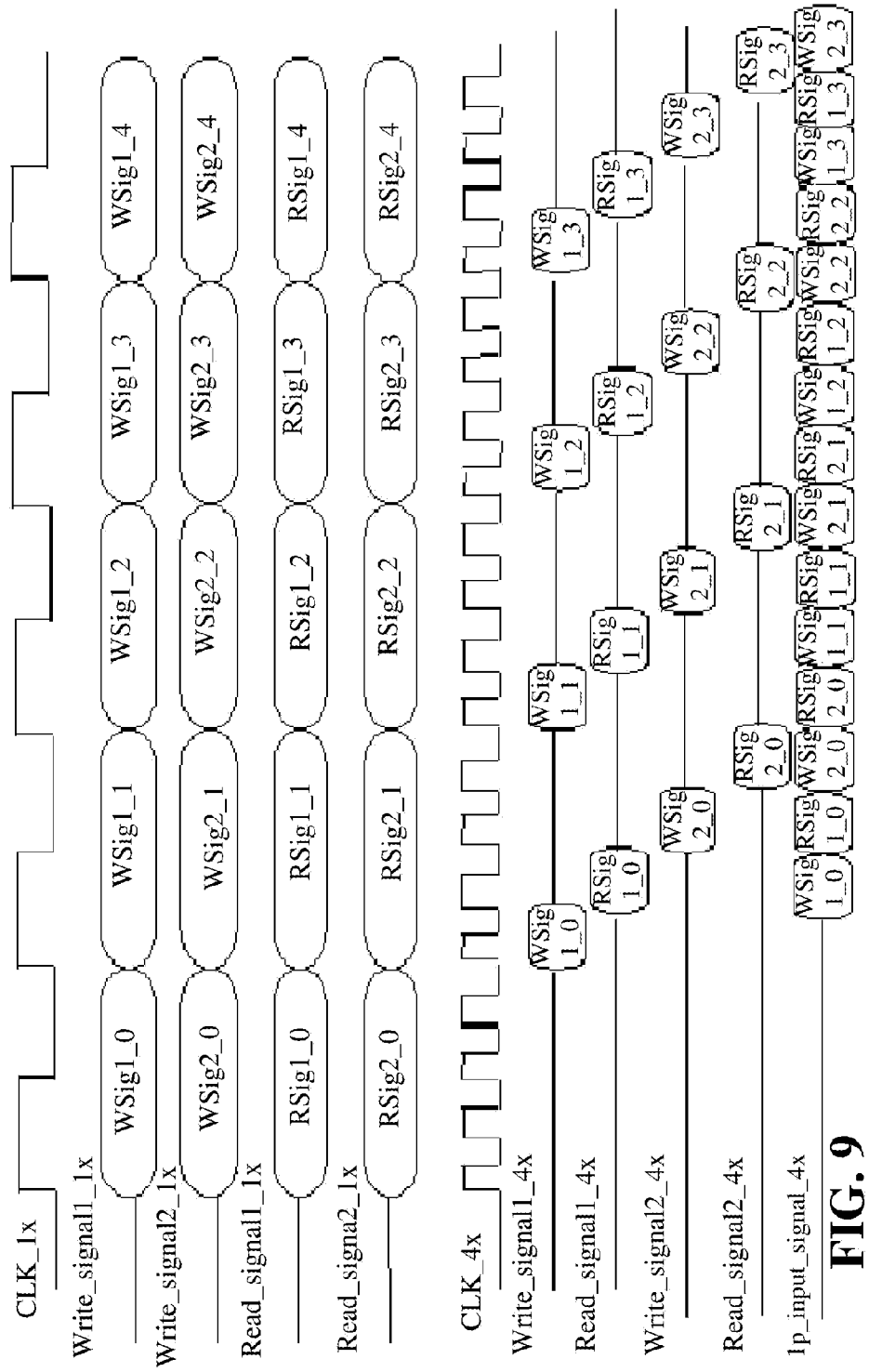
FIG. 9 shows a timing diagram illustrating the timing relationship of various signals for providing the architecture from 4-port to single port shown in FIG. 8, according to an exemplary embodiment.

FIG. 9 shows a timing diagram illustrating the timing relationship of various signals for providing the architecture from 4-port to single port shown in FIG. 8, according to an exemplary embodiment. A sequence of inputs such as the $1^{st}$ to $5^{th}$ inputs for the control signal Write_signal1__1x on the first write port are Wsig1__0~Wsig1__4; a sequence of inputs such as the $1^{st}$ to $5^{th}$ inputs for the control signal Write_signal2__1x on the second write port are Wsig2__0~Wsig2__4; a sequence of inputs such as the $1^{st}$ to $5^{th}$ inputs for the control signal Read_signal1__1x on the first read port are Rsig1__0~Rsig1__4; and a sequence of inputs such as the $1^{St}$ to $5^{th}$ inputs for the control signal Read_signal2__1x on the second read port are Rsig2__0~Rsig2__4. The four synchronized signals Write_signal1__4x, Write_signal2__4x, Read_signal1__4x and Read_signal2__4x are obtained through the synchronization to the $1^{st}$ to $5^{th}$ inputs for each of the control signals Write_signal1__1x, Write_signal2__1x, Read_signal1__1x, and Read_signal2__1x by the synchronization modules Sync_W1, Sync_W2, Sync_R1 and Sync_R2, respectively. The read/write signal selector then integrates the four synchronized signals into a control signal 1p_input_signal__4x of the single-port memory.

Figure 10:
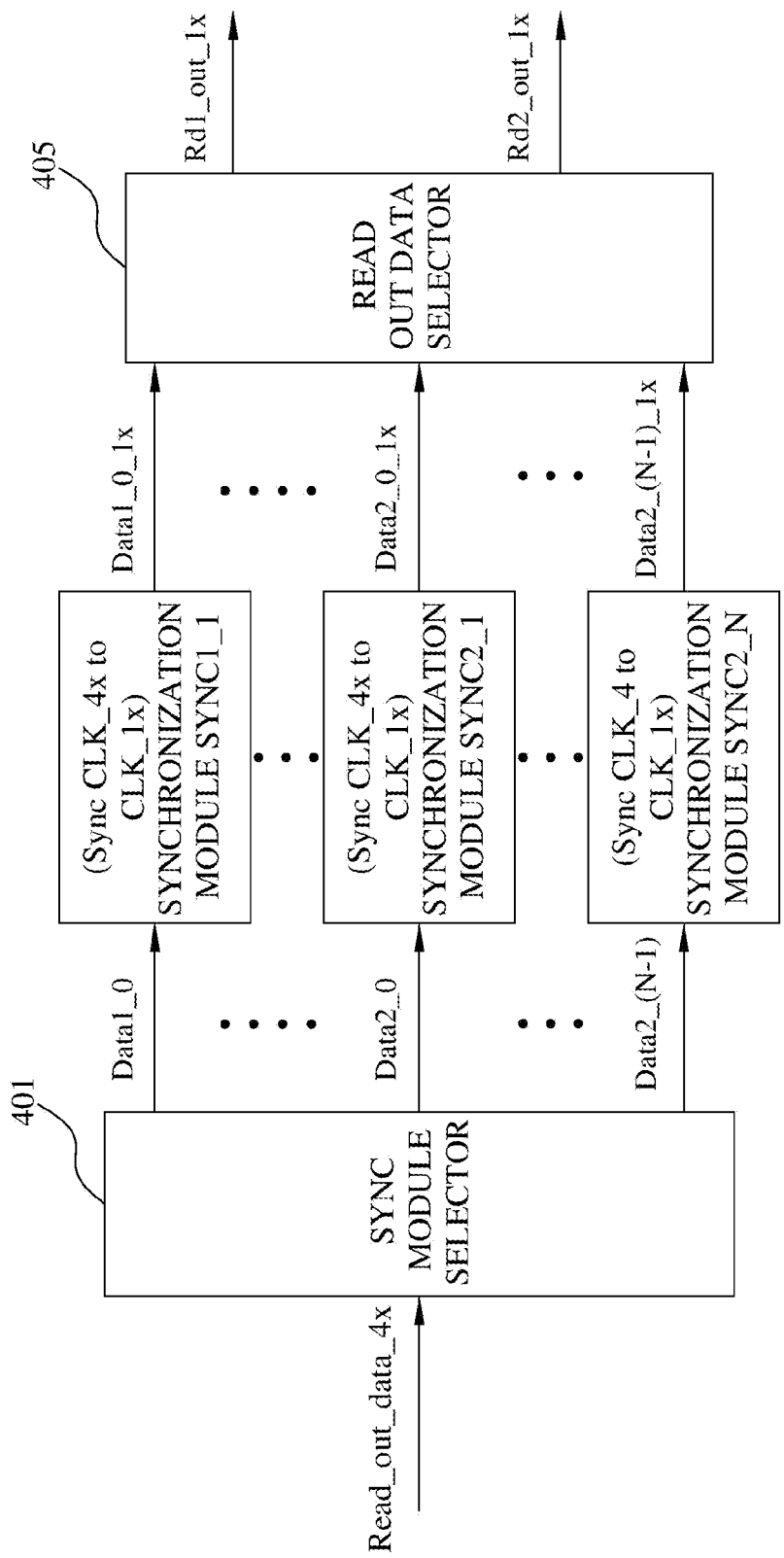
FIG. 10 shows an exemplary substitution and modification of the read out data synchronization module from single port to 4-port, according to an exemplary embodiment.

FIG. 10 shows an exemplary substitution and modification of the read out data synchronization module from single port to 4-port, according to an exemplary embodiment. The control signal 1p_input_signal__4x of the single-port memory includes two read signals, Read_signal1__4x and Read_signal2__4x. The read out data Read_out_data__4x therefore includes two sets of read out data. One set of read out data corresponding to Read_signal1__4x are Data1__0, Data1__1, . . . , Data1_(N−1), Data1_N, . . . . The other read out data corresponding to Read_signal2__4x are Data2__0, Data2__1, . . . , Data2_(N−1), Data2_N, . . . . Each set of read out data corresponding to Read_signal1__4x use N synchronization modules to perform synchronization. The first set of read out data uses N synchronization modules, i.e. synchronization module SYNC1__1~synchronization module SYNC1_N, respectively to perform synchronization. The second set of read out data use another N synchronization modules, i.e. synchronization module SYNC2__1~synchronization module SYNC2_N, respectively to perform synchronization. After synchronization, the first set of synchronized data are Data1__0__1x, Data1__0__1x, . . . , Data1_(N−1)__1x. After synchronization, the second set of synchronized data are Data2__0__1x, Data2__0__1x, . . . , Data2_(N−1)__1x. Then, the read out data selector 405 forms the two sets of read out data into read out data Rd1_out__1x and Rd2_out__1x of two ports.

Figure 11:
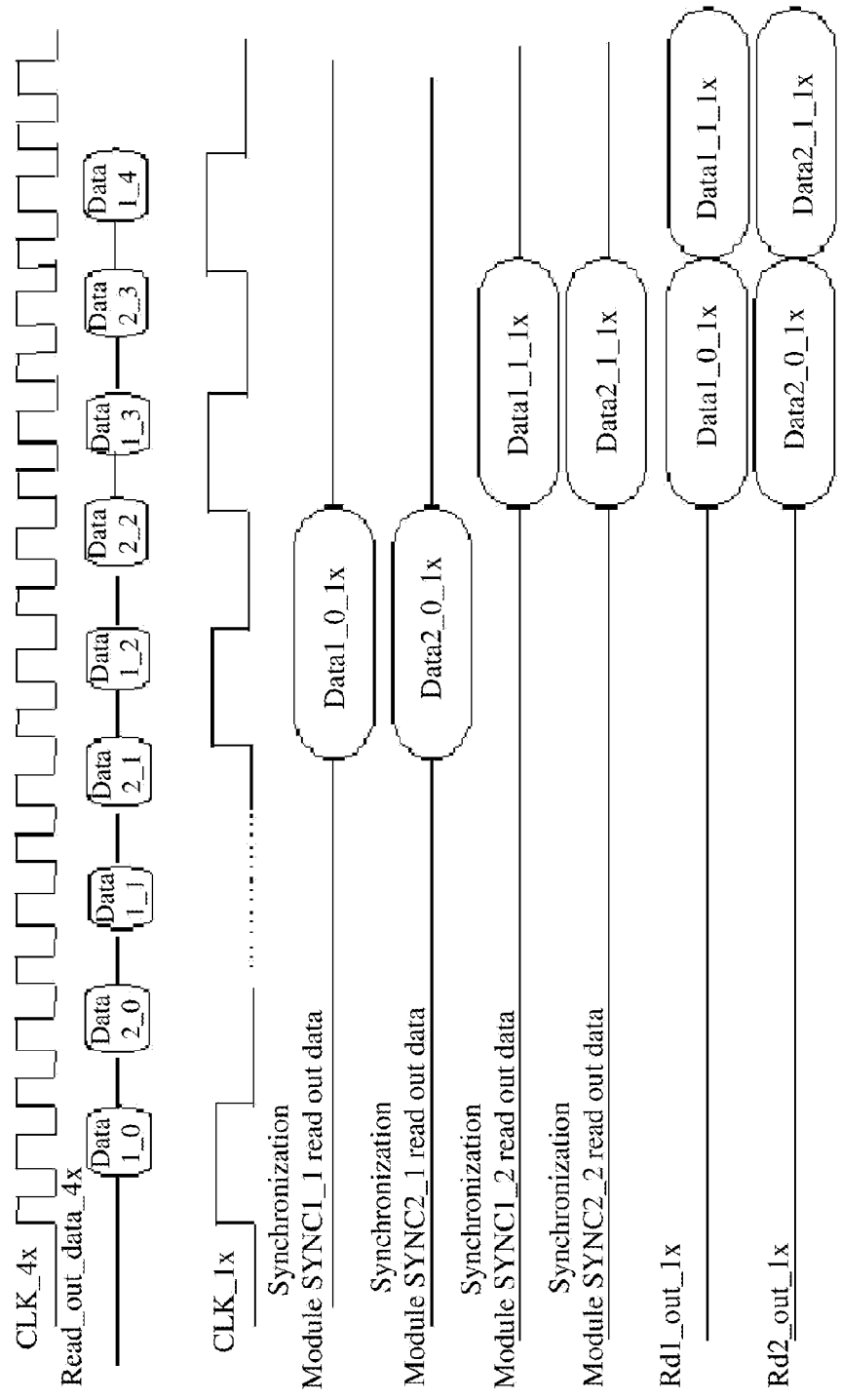
FIG. 11 shows a timing diagram to describe the timing relationship of the read out data synchronization module from single port to 4-port shown in FIG. 10, according to an exemplary embodiment.

FIG. 11 shows a timing diagram to describe the timing relationship of the read out data synchronization module from single port to 4-port shown in FIG. 10, according to an exemplary embodiment. The read out data Read_out_data__4x corresponding to the control signal 1p_input_signal__4x of the single-port memory in FIG. 9 includes two sets of read out data (of two ports), i.e. one set of Data1__0, Data1__1, . . . , and the other set of Data2__0, Data2__1, . . . . Each of the two sets of read out data use N synchronization modules to perform synchronization, i.e. synchronization module SYNC1__1~synchronization module SYNC1_N and synchronization module SYNC2__1~synchronization module SYNC2_N, respectively. After synchronization respectively by synchronization module SYNC1__1 and synchronization module SYNC2__1, the first data Data1__0 and Data2__0 of the two sets of read out data become synchronized data Data1__0__1x and Data2__0__1x, respectively. The synchronized data, i.e. Data1__0__1x and Data2__0__1x, will appear at the same time in the timing sequence with the same system operating frequency CLK__1x. After synchronization respectively by synchronization modules SYNC1__1 and SYNC2__1, the second data Data1__1 and Data2__1 of the two sets of read out data become synchronized data Data1__1__1x and Data2__1__1x. The synchronized data i.e. Data1__1__1x and Data2__1__1x, will appear at the same time immediately following the synchronized first data in the timing sequence with the same system operating frequency CLK__1x. Then, the read out data selector integrates each pair of the two sets of synchronized data to form the read out data, i.e. Rd1_out__1x, Rd2_out__1x, of two ports.

Figure 12:
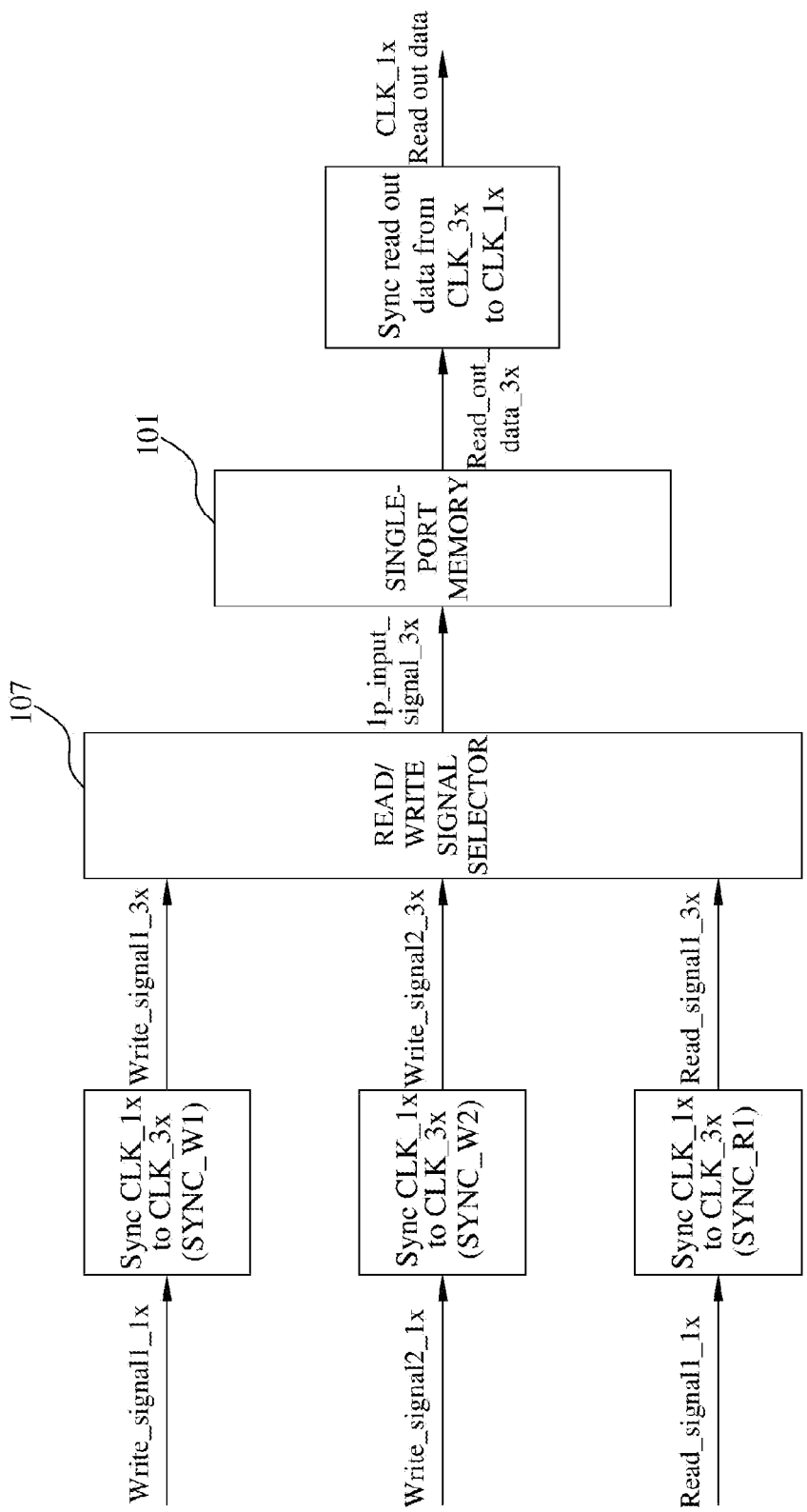
FIG. 12 shows an exemplary architecture from 3-port to single port, according to an exemplary embodiment.

FIG. 12 shows an exemplary architecture from 3-port to single port, according to an exemplary embodiment. The differences of the embodiment of FIG. 12 compared to the details of FIG. 2 are described for conciseness. Similar components (even if operated differently) are shown with similar reference numbers, again for conciseness. In FIG. 12, it is assumed that one port is for reading and the other two ports are for writing. The operating frequency CLK__3x of the single-port memory is three times of a system operating frequency CLK__1x. The Read_signal1__1x is the control signal for the read port, and the Write_signal1__1x and Write_signal2__1x are two control signals for the two write ports. Three different synchronization modules synchronously control the three control signals to the memory's operating frequency. The first read signal is Read_signal1__3x after synchronization. Similarly, the first write signal is Write_signal1__3x after synchronization, and the second write signal is Write_signal2__3x after synchronization. The three control signals are further processed by the read/write signal selector 107 to obtain a control signal 1p_input_signal__3x for the single-port memory 101. The read out data from the single-port memory 101 is read_out_data__3x. Because one port of the three ports is a read port, which is the same as the previous embodiment of the 2-port memory, wherein the read out data of the single port is read_out_data__3x. After the read out data synchronization module synchronizes the read_out_data__3x from CLK__3x to CLK__1x to the system frequency, it generates the read out data CLK__1X_Read_out_data of the single port.

Figure 13:
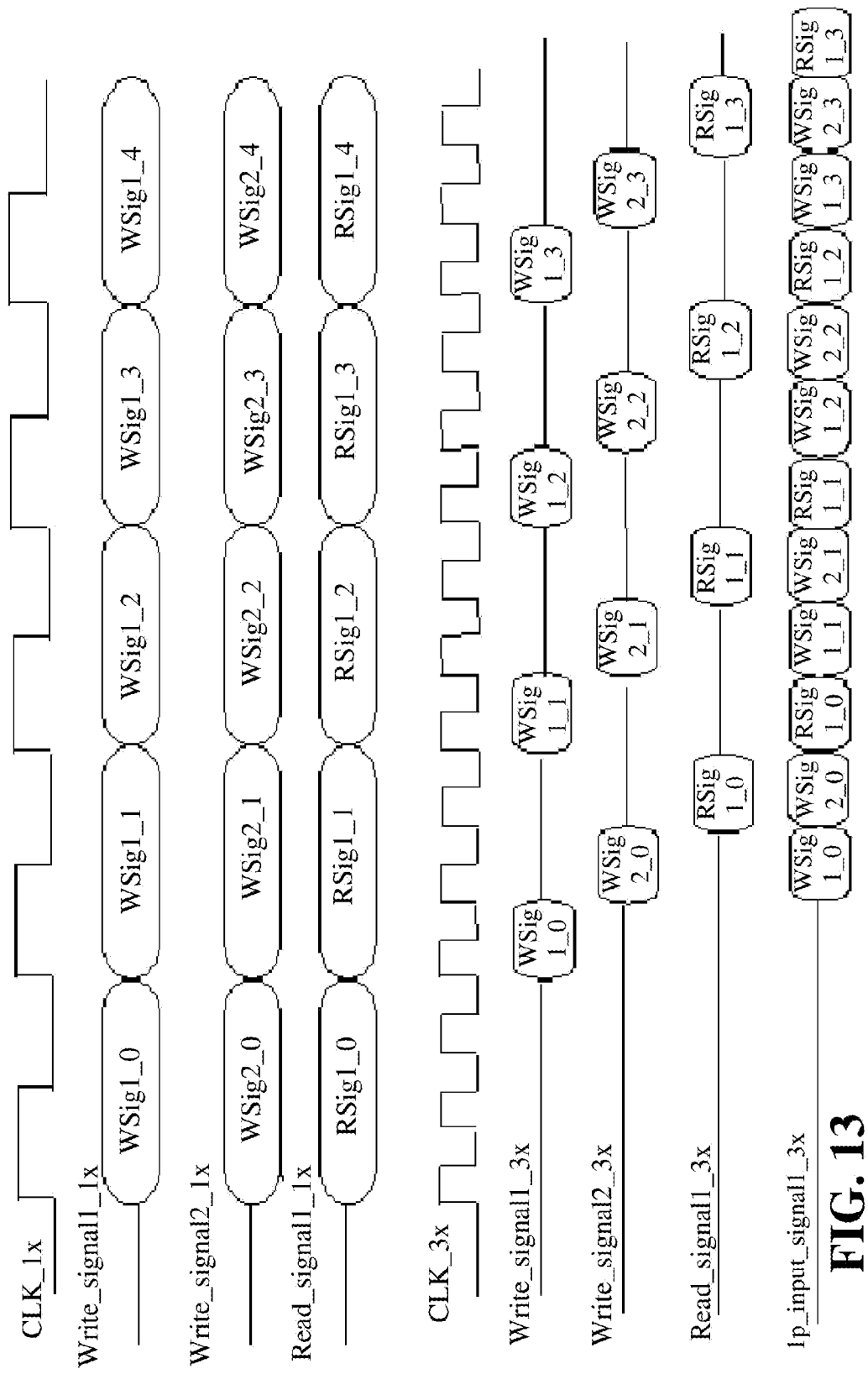
FIG. 13 shows a timing diagram illustrating the timing relationship of various signals for providing the architecture from 3-port to single port shown in FIG. 12, according to an exemplary embodiment.

FIG. 13 shows a timing diagram illustrating the timing relationship of various signals for providing the architecture from 3-port to single port shown in FIG. 12, according to an exemplary embodiment. Referring to FIG. 13, a sequence of inputs such as the $1^{st}$ to $5^{th}$ inputs for the control signal Write_signal1__1x on the first write port are Wsig1__0~Wsig1__4; a sequence of inputs such as the $1^{st}$ to $5^{th}$ inputs for the control signal Write_signal2__1x on the second write port are Wsig2__0~Wsig2__4; and a sequence of inputs such as the $1^{st}$ to $5^{th}$ inputs for the control signal Read_signal1__1x on the read port are Rsig1__0~Rsig1__4. Three synchronized signals, i.e. Write_signal1__3x, Write_signal2__3x, and Read_signal1__3x, are obtained through the synchronization by three synchronization modules, i.e. Sync_W1, Sync_W2, and Sync_R1, respectively. The read/write signal selector 107 then integrates the three synchronized signals into a control signal 1p_input_signal__3x of the single-port memory.

Figure 14:
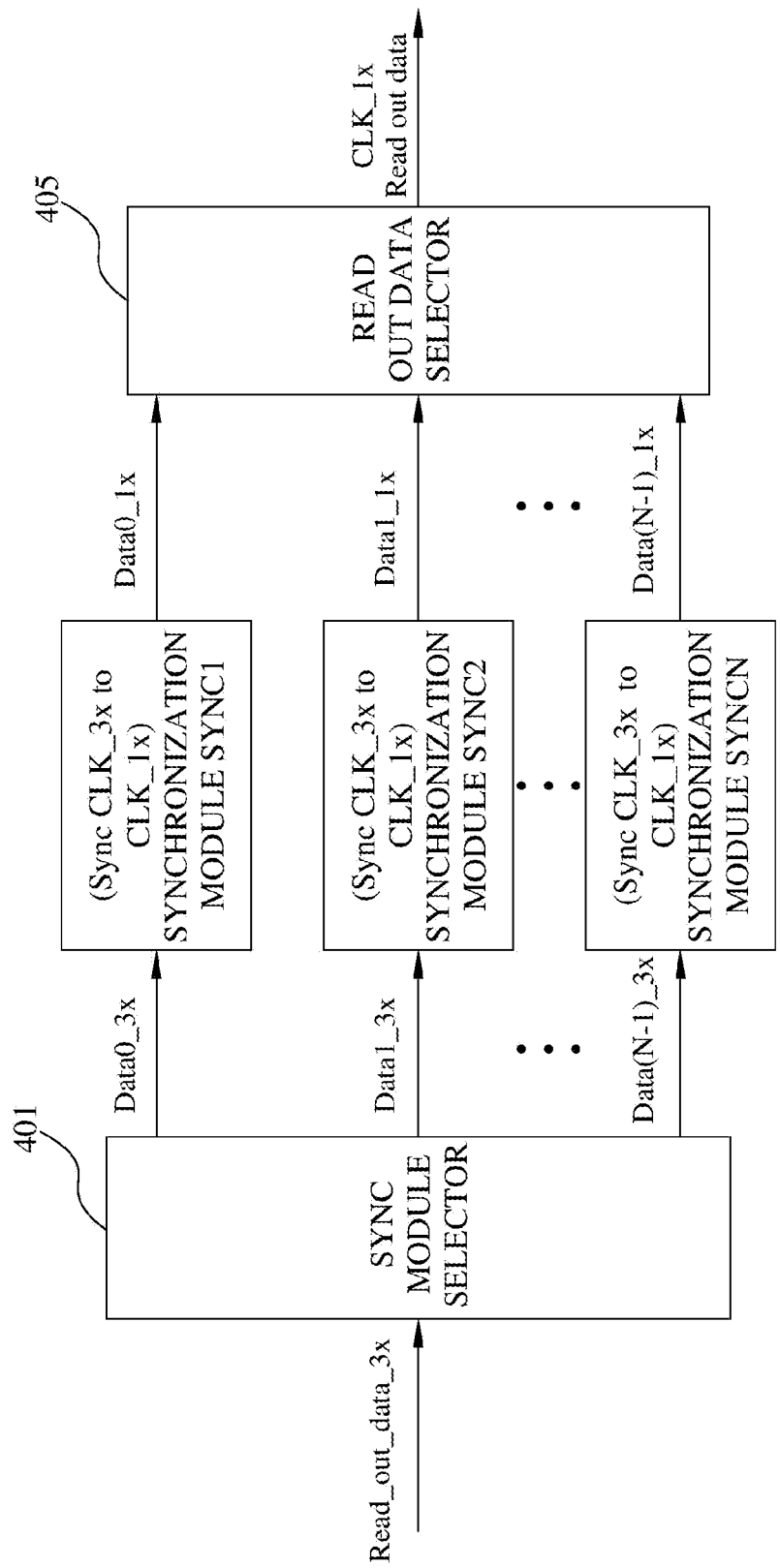
FIG. 14 shows an exemplary substitution and modification of the read out data synchronization module from single port to 3-port, according to an exemplary embodiment.

FIG. 14 shows an exemplary substitution and modification of the read out data synchronization module from single port to 3-port, according to an exemplary embodiment. The control signal 1p_input_signal__3x of the single-port memory includes one read signal Read_signal1__3x. The read out data Read_out_data__3x therefore includes two sets of read out data. The read out data corresponding to the read signal Read_signal1__3x are Data0__3x, Data1__3x, . . . , Data(N-1)__3x, DataN__3x, . . . . These read out data, similar to the previous embodiment of 2-port memory, are synchronized by N synchronization modules. After synchronization, a first set of synchronization data is Data0__1x, Data1__1x, . . . , Data(N-1)__1x. Then, the read out data selector 405 integrates the read out data to form a set of output data (i.e. CLK__1x Read out data) with the read out data format needed by the system.

Figure 15:
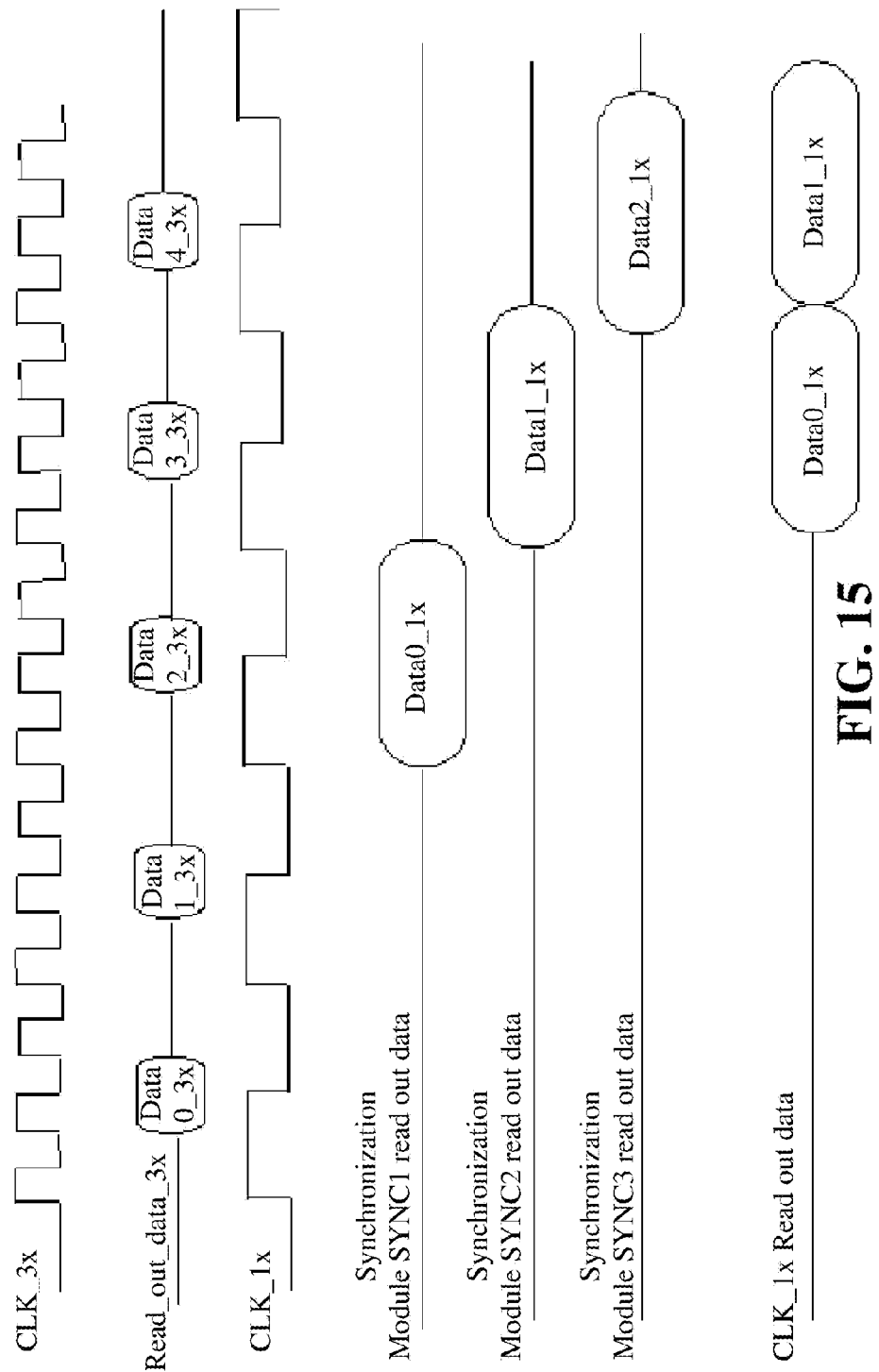
FIG. 15 shows a timing diagram to describe the timing relationship of the read out data synchronization module from single port to 3-port shown in FIG. 14, according to an exemplary embodiment.

FIG. 15 shows a timing diagram to describe the timing relationship of the read out data synchronization module from single port to 3-port shown in FIG. 14, according to an exemplary embodiment. The read out data Read_out_data__3x corresponding to the control signal 1p_input_signal__3x of the single-port memory in FIG. 12 includes one set of read out data, i.e. Data0__3x, Data1__3x, Data2__3x, . . . . These read out data, similar to the previous embodiment of 2-port memory, are synchronized by N synchronization modules, i.e. synchronization module SYNC1~synchronization module SYNCN. After synchronization, the N synchronization modules generates synchronized data Data0__1x, Data1__1x, Data2__1x, . . . . Then, the read out data selector 405 integrates these synchronized data to form the read out data CLK__1x_Read_out_data having the data format outputted at the operating frequency of an original system.

Thus, the exemplary embodiments of the disclosure provide a technique operable to provide multi-port functionality by using the architecture of single-port memory to replace the n-port memory, wherein n may be a positive integer greater than or equal to 2. In the technique, both the inputted read signals and the write signals are synchronized from the operation frequency of the multi-port memory to the operating frequency of the single-port memory. The synchronized read signals and the synchronized write signals are integrated into a set of input control signals of the single-port memory. The set of read out data of the single-port memory are synchronized from the operating frequency of the single-port memory to the operation frequency of the multi-port memory, for further operations in an original system.

Although the disclosure has been described with reference to the exemplary embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A memory device operable to provide multi-port functionality, comprising:
   a single-port memory having a first operating frequency that is at least twice of a second operation frequency of a multi-port memory;
   at least one read synchronization module synchronizing a set of read signals from the second operation frequency to the first operating frequency;
   at least one write synchronization module synchronizing a set of write signals from the second operation frequency to the first operating frequency;
   a read/write signal selector integrating a set of synchronized read signals and a set of synchronized write signals into a set of input control signals of the single-port memory; and
   a read out data synchronization module configured to synchronize a set of read out data of the single-port memory from the first operating frequency to the second operation frequency of the multi-port memory.

2. The memory device as claimed in claim 1, wherein the set of synchronized read signals and the set of synchronized write signals are distributed over different clocks in a clock domain of the single-port memory.

3. The memory device as claimed in claim 2, wherein a distributed order in the clock domain for the set of synchronized read signals and the set of synchronized write signals is decided by a system that employs the memory device.

4. The memory device as claimed in claim 1, wherein the first operating frequency of the single-port memory is at least k times of the second operation frequency of the multi-port memory, k is a positive real number, and k is greater than or equals to 2.

5. The memory device as claimed in claim 1, wherein the read out data synchronization module further includes: a group of synchronization modules synchronizing the set of read out data of the single-port memory from the first operating frequency to an operating frequency of a system for further operations in the system.

6. The memory device as claimed in claim 5, wherein a number of the group of synchronization modules is greater than or equal to M, and M is a number of clocks of a maximum timing latency caused by the synchronization from the first operating frequency to the system's operating frequency.

7. The memory device as claimed in claim 5, wherein the read out data synchronization module further includes: a Sync module selector controlling each of the set of read out data from the single-port memory to use which one of the group of synchronization modules.

8. The memory device as claimed in claim 5, wherein a counter is used as a control indicator to indicate a corresponding synchronization module of the group of synchronization modules for each read out data in a synchronization process.

9. The memory device as claimed in claim 7, wherein the Sync module selector determines which synchronization module is selected and when the selected Sync module starts up for each of the set of read out data.

10. The memory device as claimed in claim 7, wherein the Sync module selector takes turn to enable a different synchronization module of the group of Sync modules for each read out data from the single-port memory.

11. The memory device as claimed in claim 5, wherein the read out data synchronization module further includes: a read out data selector integrating the synchronized read out data from the group of synchronization modules into a set of output data with a data format of the multi-port memory.

12. A method operable to provide multi-port functionality, comprising:
    providing a single-port memory having a first operating frequency that is at least twice of a second operation frequency of a multi-port memory;
    synchronizing a set of read signals from the second operation frequency to the first operating frequency, and synchronizing a set of write signals from the second operation frequency to the first operating frequency;
    integrating a set of synchronized read signals and a set of synchronized write signals into a set of input control signals of the single-port memory; and
    synchronizing a set of read out data of the single-port memory from the first operating frequency to the second operation frequency of the multi-port memory.

13. The method as claimed in claim 12, wherein the method further includes: distributing the set of synchronized read signals and the set of synchronized write signals over different clocks in a clock domain of the single-port memory.

14. The method as claimed in claim 13, wherein a distributed order in the clock domain for the set of synchronized read signals and the set of synchronized write signals is decided by a system employing a memory device that the method is adapted to.

15. The method as claimed in claim 12, wherein the first operating frequency of the single-port memory is at least k times of the second operation frequency of the multi-port memory, k is a positive real number, and k is greater than or equals to 2.

16. The method as claimed in claim 12, wherein synchronizing the set of read out data of the single-port memory from the first operating frequency to the second operation frequency further includes:
    synchronizing, by a group of synchronization modules, the set of read out data of the single-port memory from the first operating frequency to an operating frequency of a system for further operations in the system; and
    integrating, by a read out data selector, the synchronized read out data from the group of synchronization modules into a set of output data with a data format of the multi-port memory.

17. The method as claimed in claim 16, wherein said method further includes:
    controlling, by a Sync module selector, each of the set of read out data from the single-port memory to use which one of the group of synchronization modules.

18. The method as claimed in claim 17, wherein the method further includes: determining, by the Sync module selector, which synchronization module is selected and when the selected synchronization module starts up for each of the set of read out data.

19. The method as claimed in claim 18, wherein said method further includes: taking turn to enable a different synchronization module of the group of synchronization modules for each read out data from the single-port memory.

* * * * *